United States Patent [19]
Nishida

[11] Patent Number: 5,987,315
[45] Date of Patent: Nov. 16, 1999

[54] DIODE CIRCUIT IN DIELECTRIC WAVEGUIDE DEVICE, AND DETECTOR AND MIXER USING THE DIODE CIRCUIT

[75] Inventor: Hiroshi Nishida, Kawanishi, Japan

[73] Assignee: Murata Manufacturing Co., Ltd., Japan

[21] Appl. No.: 08/924,015

[22] Filed: Aug. 29, 1997

[30] Foreign Application Priority Data

Aug. 29, 1996 [JP] Japan ..................................... 8-228377

[51] Int. Cl.[6] .................................................... H04B 1/26
[52] U.S. Cl. ........................ 455/327; 455/328; 455/330; 333/248
[58] Field of Search ..................................... 333/239, 248, 333/250; 455/313, 323, 327, 328, 330; 327/113, 356

[56] References Cited

U.S. PATENT DOCUMENTS

| | | | |
|---|---|---|---|
| 4,453,802 | 6/1984 | Bridges et al. ........................ | 333/248 |
| 4,463,330 | 7/1984 | Yoneyama ............................. | 333/248 |
| 5,640,700 | 6/1997 | Shingyoji et al. .................... | 333/250 |
| 5,770,989 | 6/1998 | Ishikawa et al. ..................... | 333/248 |

Primary Examiner—Nguyen Vo
Attorney, Agent, or Firm—Ostrolenk, Faber, Gerb & Soffen, LLP

[57] ABSTRACT

A diode circuit in a dielectric waveguide device designed to improve the facility with which a circuit substrate is mounted in the dielectric waveguide, to make matching between a dielectric waveguide and a diode easier, and to reduce conversion losses, and a detector and a mixer using such a diode circuit. A conductor pattern is disposed so as to intersect a pair of dielectric strips substantially perpendicularly to the same, and two filter circuits are formed in the dielectric pattern on opposite sides of the dielectric strips, thereby forming a resonance circuit. A diode is mounted in the resonance circuit in series with the conductor pattern.

9 Claims, 14 Drawing Sheets

DIODE CIRCUIT IN DIELECTRIC WAVEGUIDE DEVICE, AND DETECTOR AND MIXER USING THE DIODE CIRCUIT

BACKGROUND OF THE INVENTION

1. Field of the Invention

The present invention relates to a diode circuit in a dielectric waveguide device for use in, for example, a transmitter-receiver for a millimeter wave or microwave band, and to a detector and a mixer using the diode circuit.

2. Description of the Related Art

A diode circuit in a nonradiative dielectric waveguide (hereinafter referred to as "NRD guide"), and a detector and a mixer using the diode circuit have been disclosed in (1) Kuroki and Yoneyama, "Nonradiative Dielectric Waveguide Circuit Elements Using Beam Lead Diode", Collected Papers of The Institute of Electronics, Information and Communication Engineers, C-1, vol.J73-C-I No.2, pp.71–76, February 1989. Also, a detector arranged in an H guide has been disclosed in (2) F. A. Benson, P. A. Cudd, F. J. Tischer, "Solid-State Device In H-Guide, Groove Guide and Fence Guide", Electron. Lett., 18th August 1983, Vol.19, No.17, pp.657–658.

In the structure shown in document (1), a circuit substrate on which a diode is mounted is disposed so as to intersect a dielectric strip in a direction perpendicular to the lengthwise direction of the dielectric strip, and electromagnetic waves propagating through the dielectric strip are coupled with the diode on the circuit substrate. In the arrangement described in document (2), a circuit substrate on which a linear electrode pattern is formed is interposed between central portions of an H guide, and diodes are mounted on the electrode pattern on the opposite sides of a dielectric strip at distances of $\frac{1}{10}$ wavelength from the dielectric strip, thus forming a detector.

In the structure shown in document (1), however, the circuit substrate cannot easily be fixed in the device and is liable to incline, since the circuit substrate on which the diode is mounted is disposed in a direction perpendicular to the lengthwise direction of the dielectric strip. Thus, this structure is disadvantageous in terms of mounting. Moreover, there is a need to insert a high-dielectric-constant thin plate or to form a gap in the NRD guide for the purpose of matching. Therefore, the device using this structure is difficult to design and manufacture. In document (2), no structure is described for stopping propagation (leakage) of millimeter waves at the opposite ends of the suspended line (described as a "stripline" in the document) in which the diodes are mounted, and matching between the H guide and the diodes is not considered. Consequently, the loss due to leakage of millimeter waves out of the suspended line is so large that the diodes cannot receive sufficient energy, resulting in a large conversion loss.

SUMMARY OF THE INVENTION

In view of the above-described problems, an advantageous feature of the present invention is to provide a diode circuit in a dielectric waveguide device designed to improve the facility with which a circuit substrate is mounted in the dielectric waveguide, to make matching between a dielectric waveguide and a diode easier, and to reduce the conversion loss.

Another advantageous feature of the present invention is to provide a detector and a mixer using such a diode circuit.

To achieve these advantages, according to one aspect of the present invention, there is provided a diode circuit in a dielectric waveguide device, comprising a pair of flat conductor surfaces substantially parallel to each other, a dielectric strip and a circuit substrate provided between the conductor surfaces, the flat conductor surfaces and the conductor strip forming a dielectric waveguide, an elongated conductor pattern formed on the circuit substrate so as to extend across the dielectric strip substantially perpendicularly to the same, the conductor pattern and the flat conductor surfaces forming a suspended line, a filter circuit provided at each of at least two places in the conductor pattern on opposite sides of the dielectric strip to form a resonance circuit, the filter circuit stopping a signal coupled with the dielectric waveguide and propagating through the suspended line, and a diode mounted in series with the conductor pattern in the resonance circuit. In this structure, the suspended line and the dielectric waveguide are magnetic-field-coupled to each other, and a signal propagating through the dielectric waveguide is applied to the suspended line. The filter circuits stop the signal coupled with the suspended line from propagating to the outside, and the resonance circuit between the filter circuits resonates with the signal.

In the above-described structure, the circuit substrate is disposed between the two flat conductor surfaces substantially parallel to each other. Thus, the facility with which the circuit substrate is mounted by being combined with the dielectric waveguide is improved. Also, the conductor pattern is disposed so as to intersect the dielectric strip substantially perpendicularly, and filter circuits are provided at each of at least two places in the conductor pattern on opposite sides of the dielectric strip, thereby forming a resonance circuit. Also, a diode is mounted in the resonance circuit. Therefore, the suspended line forming the resonance circuit is coupled to the dielectric waveguide and resonates with the same to supply sufficiently large energy from the dielectric waveguide to the diode. That is, suitable matching between the dielectric waveguide and the diode can be achieved, thereby sufficiently limiting the conversion loss.

According to another aspect of the present invention, in the above-described diode circuit, the electrical Length between the two filter circuits forming the resonance circuit may be set to an integer multiple of approximately ½ wavelength of the frequency of the signal propagating through the dielectric waveguide, thereby enabling the resonance circuit to resonate with the target signal propagating through the dielectric waveguide so that the conversion efficiency is maximized.

According to still another aspect of the present invention, there is provided a detector comprising a dielectric waveguide device including the above-described diode circuit. A radio-frequency signal is input, for example, as a received signal to the dielectric waveguide, and a detected signal is extracted out of the resonance circuit of the conductor pattern. That is, a DC level signal detected by the diode is extracted through the filter circuit of the conductor pattern form the outside of the resonance circuit.

According to a further aspect of the present invention, there is provided a mixer comprising a dielectric waveguide device including the above-described diode circuit. A signal obtained by mixing a radio-frequency signal and a local signal is input the dielectric waveguide. A bias voltage is applied to the diode from the outside of the resonance circuit of the conductor pattern. An intermediate-frequency signal is extracted from the outside of the resonance circuit. That is, when the diode receives the radio-frequency signal and the local signal, it generates harmonic components of the two frequency components due to its nonlinearity. Unnecessary frequency components are removed by the filter circuits, so that the frequency signal corresponding to the difference between the radio-frequency signal and the local signal is extracted as an intermediate-frequency signal.

DESCRIPTION OF EMBODIMENTS OF THE INVENTION

A diode mount structure in a dielectric waveguide device and a detector which represent a first embodiment of the present invention will be described with reference to FIGS. 1 to 3.

Figure 1A:
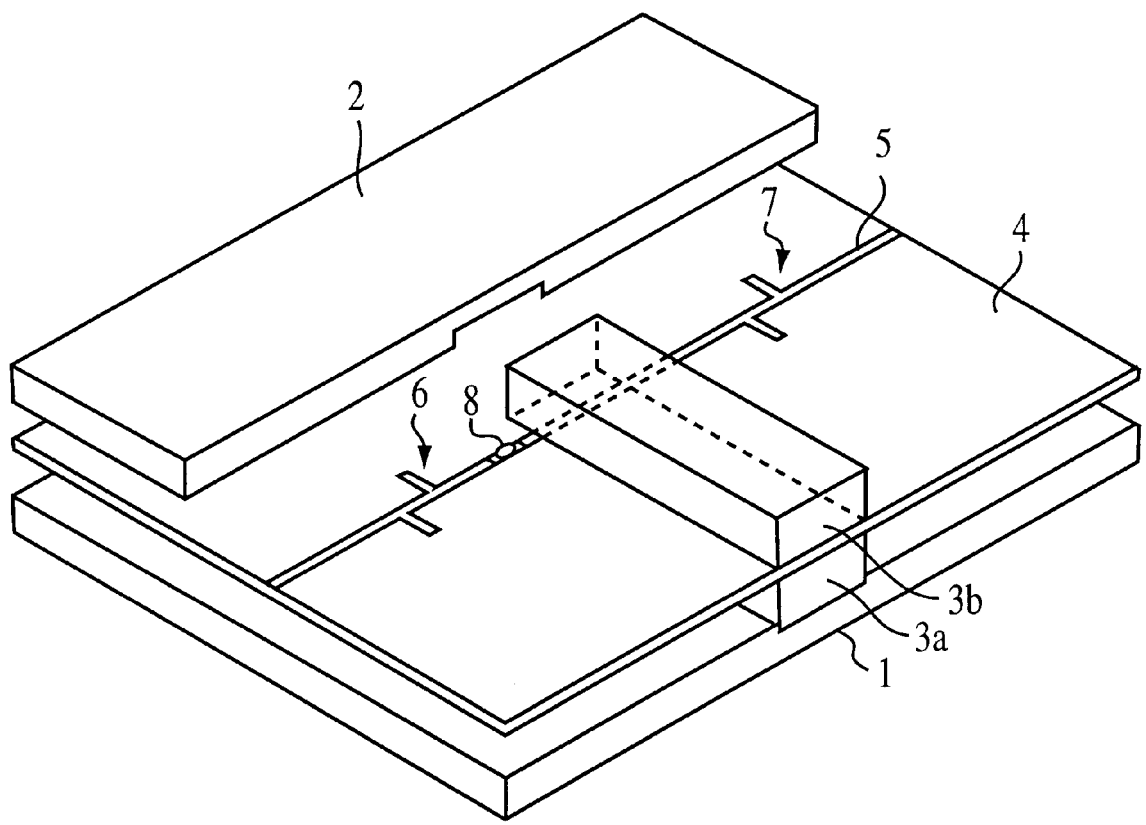
FIGS. 1A and 1B are perspective and front views of a dielectric waveguide device which represents a first embodiment of the present invention, showing a diode circuit and the structure of a detector.
Figure 1B:
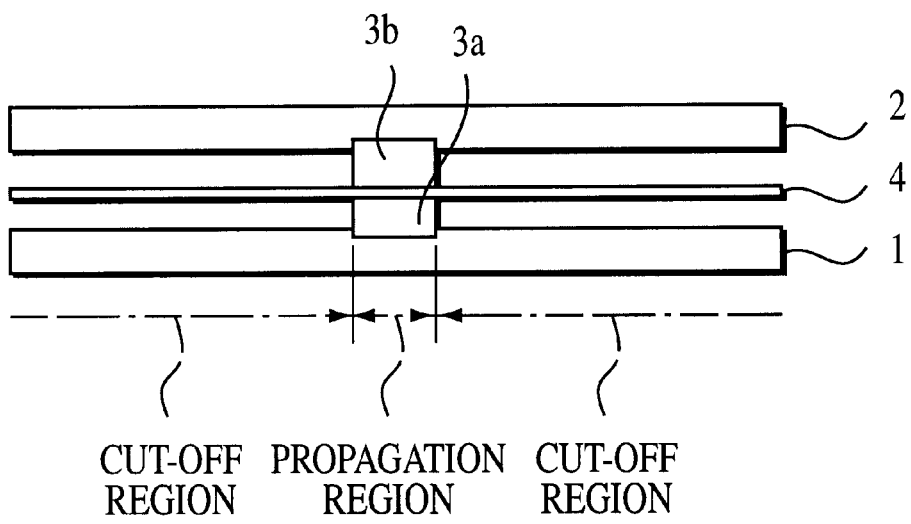

FIGS. 1A and 1B is a diagram showing the structure of a dielectric waveguide device used as a detector. FIG. 1A is a partially fragmentary perspective view and FIG. 1B is a front view seen in the direction from the front-right side to the rear-left side of FIG. 1A. Referring to FIGS. 1A and 1B, conductor plates 1 and 2 are disposed so as to form two parallel conductor surfaces, and dielectric strips 3a and 3b are disposed between the two conductor plates 1 and 2 with a circuit substrate 4 interposed between the dielectric strips 3a and 3b. Grooves are respectively formed in inner surfaces of the conductor plates 1 and 2, and the dielectric strips 3a and 3b are fitted in these grooves. The circuit substrate 4 is supported at its peripheral portions (not shown) on supporting members so as to be positioned midway between the conductor plates 1 and 2 in the vertical direction as viewed in FIGS. 1A or 1B and parallel to the conductor plates 1 and 2. Peripheral portions (not shown) of the conductor plates 1 and 2 are attached together while portions in a dielectric waveguide region form two parallel flat conductor surfaces, as illustrated.

Each of the dielectric strips 3a and 3b shown in FIG. 1 is formed of a dielectric material such as a resin or a ceramic and has a substantially rectangular cross section perpendicular to its lengthwise direction. The distance between the conductor plates 1 and 2 is set to a value smaller than $\lambda/2$ if the wavelength of millimeter electromagnetic waves to be transmitted is $\lambda$, thereby ensuring that propagation of electromagnetic waves as polarized waves parallel to the conductor plates 1 and 2 is stopped in the region other than the dielectric strips 3a and 3b, and that this stoppage is made ineffective in the dielectric strips 3a and 3b to enable electromagnetic waves to propagate along the dielectric strips 3a and 3b. That is, the dielectric strips 3a and 3b and the upper and lower conductor plates 1 and 2 form an NRD guide. In this embodiment, LSM01 mode is used as a transmission mode.

A conductor pattern 5 is provided on the upper surface of the circuit substrate 4, as viewed in FIG. 1. The conductor pattern 5 extends in a direction substantially perpendicular to the lengthwise direction of the dielectric strips 3a and 3b. The conductor pattern 5 and the upper and lower conductor plates 1 and 2 form a suspended line. Filter circuits 6 and 7 are formed on the conductor pattern 5 at positions on the opposite sides of the dielectric strip region. Further, a beam lead diode 8 is mounted on an intermediate portion of the conductor pattern 5 and connected in series with the same.

Figure 2:
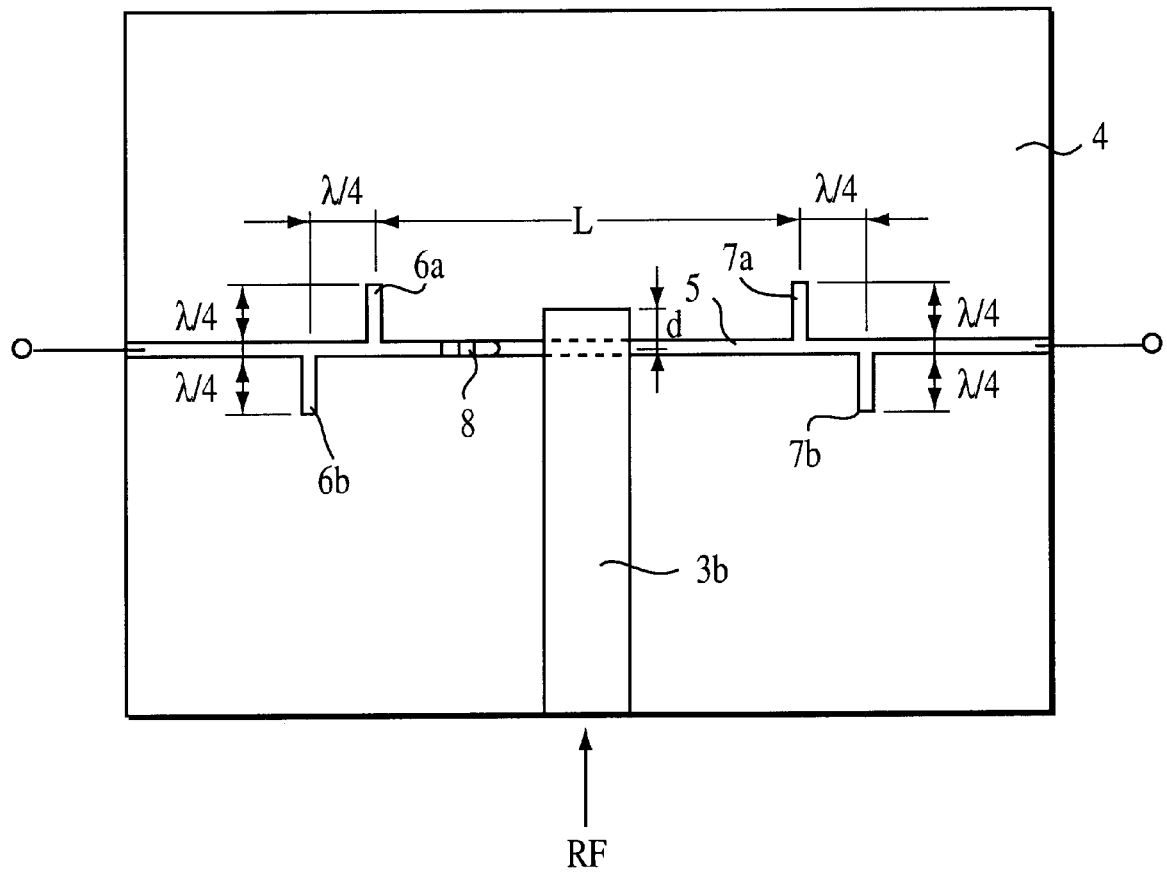
FIG. 2 is a schematic top view of the dielectric waveguide device, the upper conductor plate being omitted.

FIG. 2 is a plan view of the dielectric waveguide device shown without the upper conductor plate. Open stubs 6a, 6b, 7a, and 7b each have a length approximately equal to $\lambda/4$. The respective distances between the open stubs 6a and 6b and between the open stubs 7a and 7b are each also approximately equal to $\lambda/4$. The distance L between the open stubs 6a and 7a is selected so that the electrical distance therebetween is an integer multiple of approximately ½ wavelength at the frequency of millimeter waves propagating in the NRD guide. The arrangement of $\lambda/4$ open stubs thus disposed at the distance of $\lambda/4$ is represented by an equivalent circuit shown in FIG. 3, and operates as a band elimination filter (BEF) which cuts off a frequency signal of wavelength $\lambda$.

Also, these two filter circuits operate as a resonance circuit using a suspended line having a length equal to an integer multiple of ½ wavelength and short-circuited at both ends since the electrical distance between the filter circuits is set to an integer multiple of approximately ½ wavelength at the frequency of millimeter waves propagating in the NRD guide. The suspended line forming the resonance circuit and the NRD guide formed by the dielectric strips 3a and 3b are magnetic-field-coupled to each other, and the resonance circuit resonates with an RF signal propagating through the NRD guide. Since the beam lead diode 8 is mounted in series with the conductor pattern 5 in the resonance circuit, the NRD guide and the diode are matched to enable a detection signal to be extracted from the two ends of the conductor pattern 5.

To set the electrical length between the two filters to an integer multiple of approximately ½ wavelength of the frequency of millimeter waves propagating through the NRD guide, the corresponding geometrical distance may be determined by considering the length of coupled portions of the dielectric strips 3a and 3b and the suspended line, i.e., the length of the portion of the conductor pattern interposed between the dielectric strips 3a and 3b, the dielectric constant of the circuit substrate and the reactance component of the beam lead diode 8, or may be determined experimentally.

Figure 3:
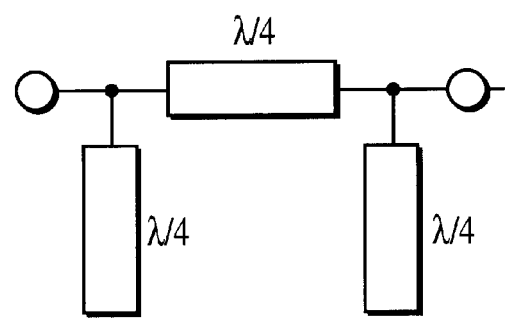
FIG. 3 is an equivalent circuit diagram of the filter circuit in the waveguide device.
Figure 4A:
FIGS. 4A to 4D are diagrams showing other filter circuit arrangements.
Figure 4B:
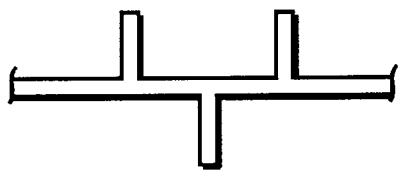
Figure 4C:
Figure 4D:
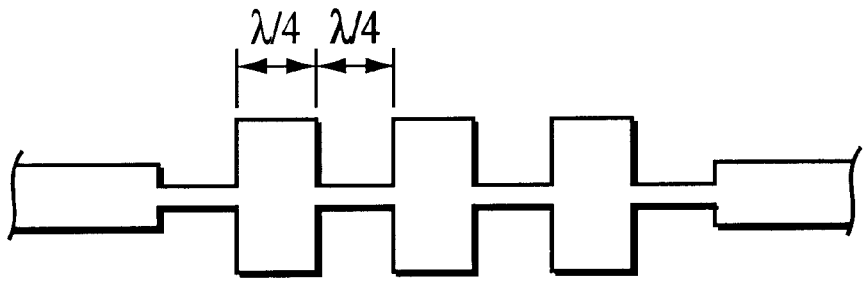

Each of the filter circuits shown in FIGS. 1 to 3 is formed by disposing two open stubs spaced apart by a predetermined distance. However, a single λ/4 open stub may alternatively be provided, as shown in FIG. 4A, if a narrower stopped frequency band may suffice. Conversely, if a wider stopped frequency band is required, three or more open stubs may be provided, as shown in FIG. 4B. In such a case, the length of the stubs and the distance between the stubs may be varied according to the desired stopped frequency band. Even in the case where a single open stub is provided, the stopped frequency bandwidth can be increased by selecting a suitable pattern shape, as shown in FIG. 4C. Further, a transmission line capacitor and inductor may be provided in the conductor pattern to form a low-pass filter (LPF) for cutting off the resonant frequency of the above-described resonant circuit.

Figure 5:
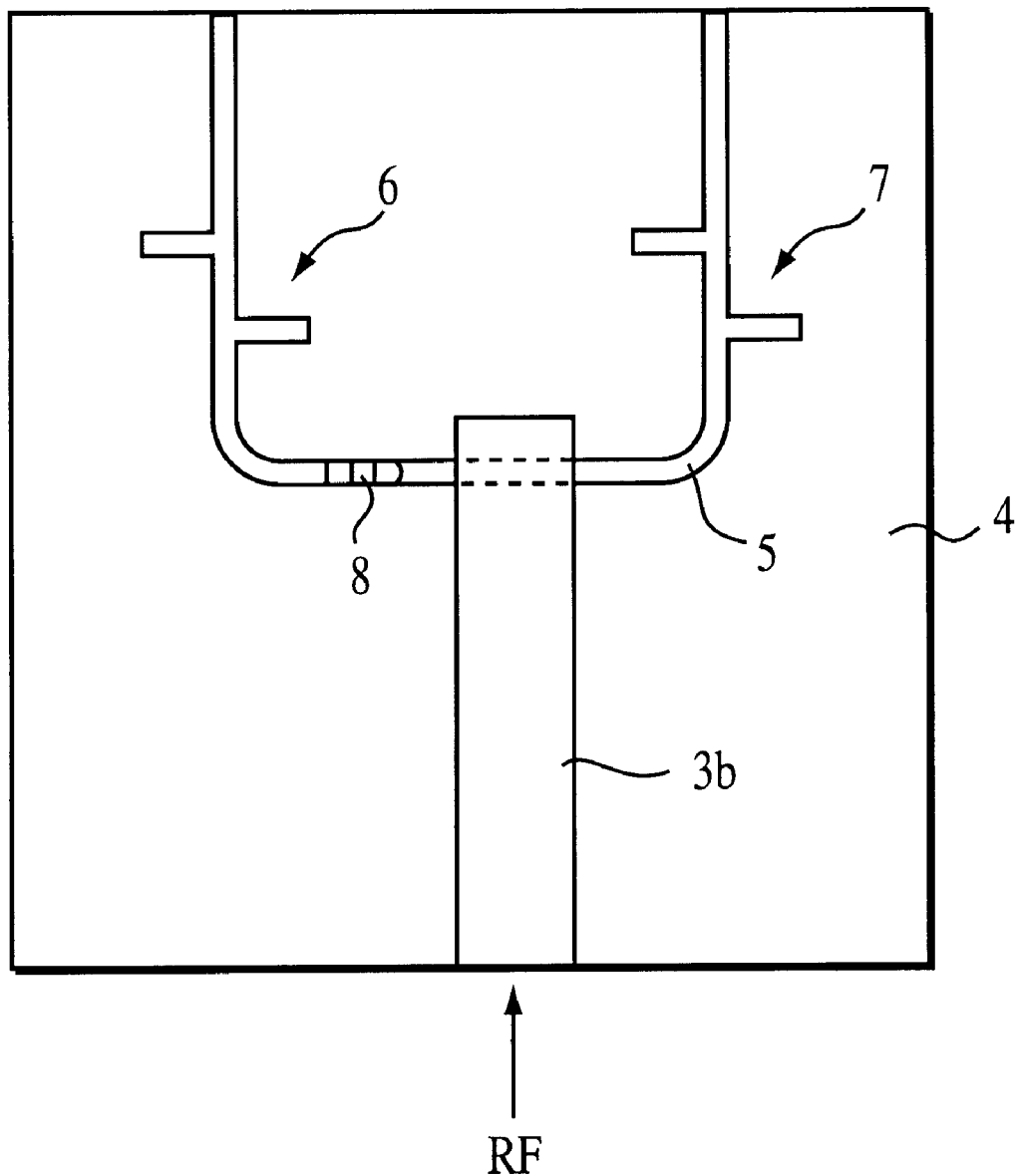
FIG. 5 is another example of the conductor pattern.

In the example of the dielectric waveguide device shown in FIGS. 1 and 2, the conductor pattern is formed linearly on the circuit substrate. However, such a linear conductor pattern is not exclusively used. For example, a conductor pattern, such as shown in FIG. 5, having curved portions, or a conductor pattern curved through its entire length may be formed.

Figure 6A:
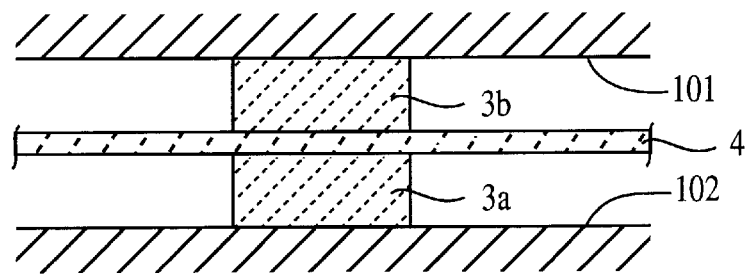
FIGS. 6A to 6D are diagrams showing other dielectric waveguide structures.
Figure 6B:
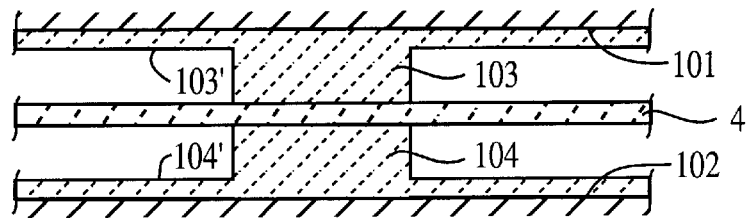
Figure 6C:
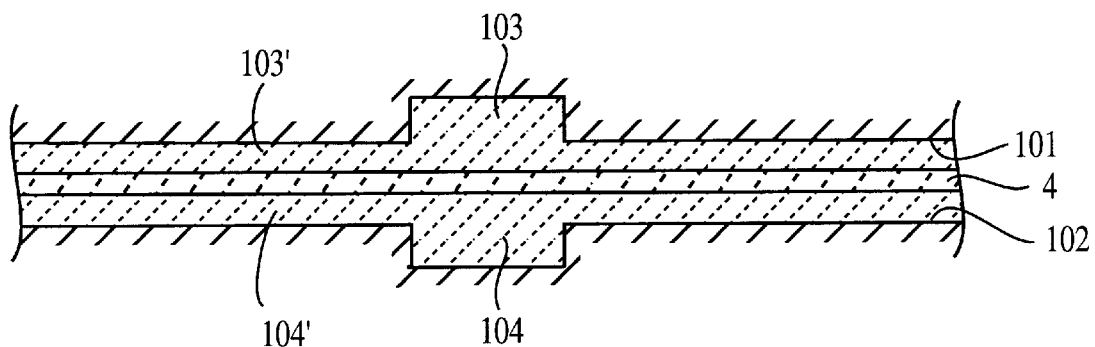
Figure 6D:
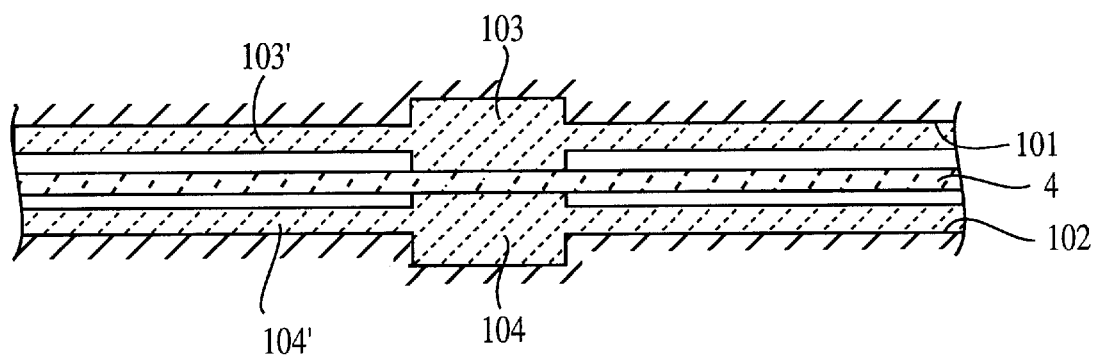

In the example shown in FIG. 1, the waveguide device has a structure with grooves formed in the conductor plates and the dielectric strips are fitted in the grooves. However, the arrangement may alternatively be such that, as shown in FIG. 6A, dielectric strips 3a and 3b and circuit substrate 4 are interposed between flat conductor surfaces 101 and 102 without grooves. A structure such as shown in FIGS. 6B, 6C, or 6D may also be used. That is, dielectric strips 103 and 104 having wings (flanges) 103' and 104' are prepared, conductor surfaces 101 and 102 are formed of plating films or the like on the outer surfaces of the wings 103' and 104', and circuit substrate 4 is interposed between the dielectric strips 103 and 104.

Figure 7:
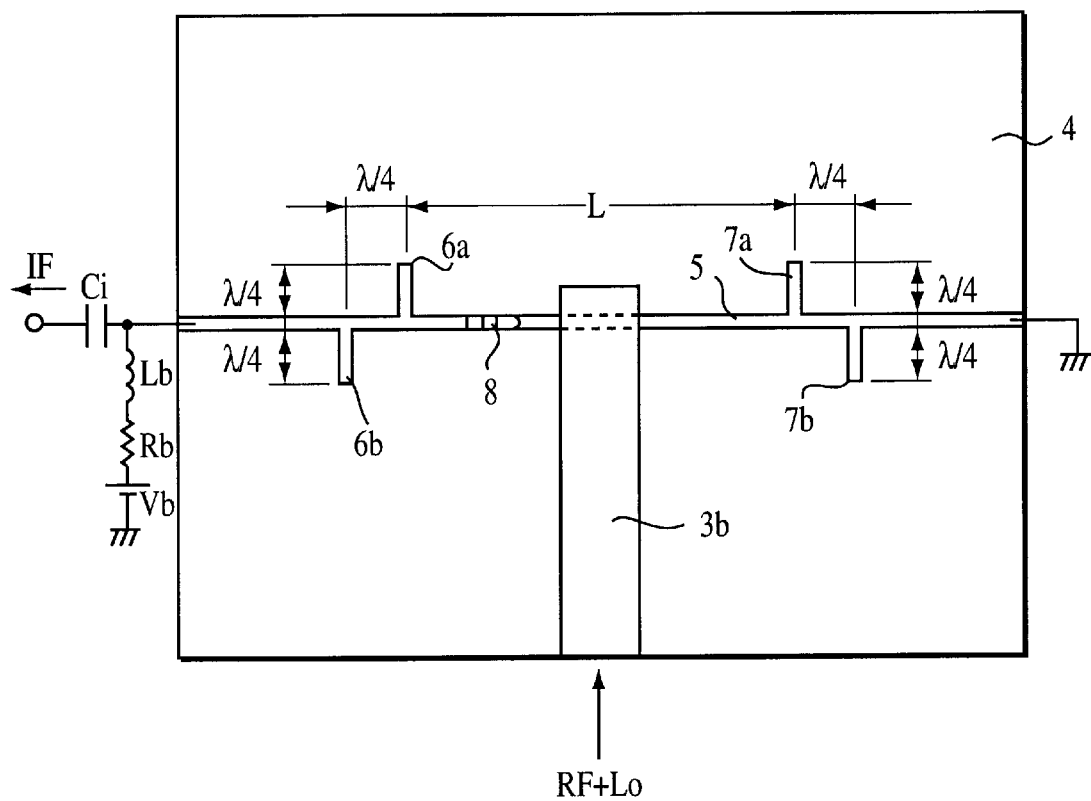
FIG. 7 is a diagram showing the configuration of a mixer which represents a second embodiment of the present invention.

A mixer which presents a second embodiment of the present invention will next be described with reference to FIGS. 7 and 8. This mixer, having the same dielectric waveguide device structure as the first embodiment shown in FIGS. 1 and 2, has one end of the conductor pattern 5 grounded. A bias voltage supply circuit comprising components Lb, Rb, and Vb, as shown in FIG. 7, is connected to the other end of the conductor pattern 5. From this mixer, an intermediate-frequency (IF) signal is extracted through a capacitor Ci. That is, in this mixer, a signal which is a mixture of an RF signal and a local oscillator (Lo) signal is transmitted through the dielectric strips 3a and 3b, a bias voltage is applied to the beam lead diode 8, which is a Schottky barrier diode in the resonance circuit, and the frequency component obtained as the difference between the RF signal and the Lo signal is extracted as an IF signal through the capacitor Ci. The inductor Lb stops leakage of the IF signal to the bias power supply circuit, and the capacitor Ci stops the bias voltage from being applied to the IF circuit.

Figure 8A:
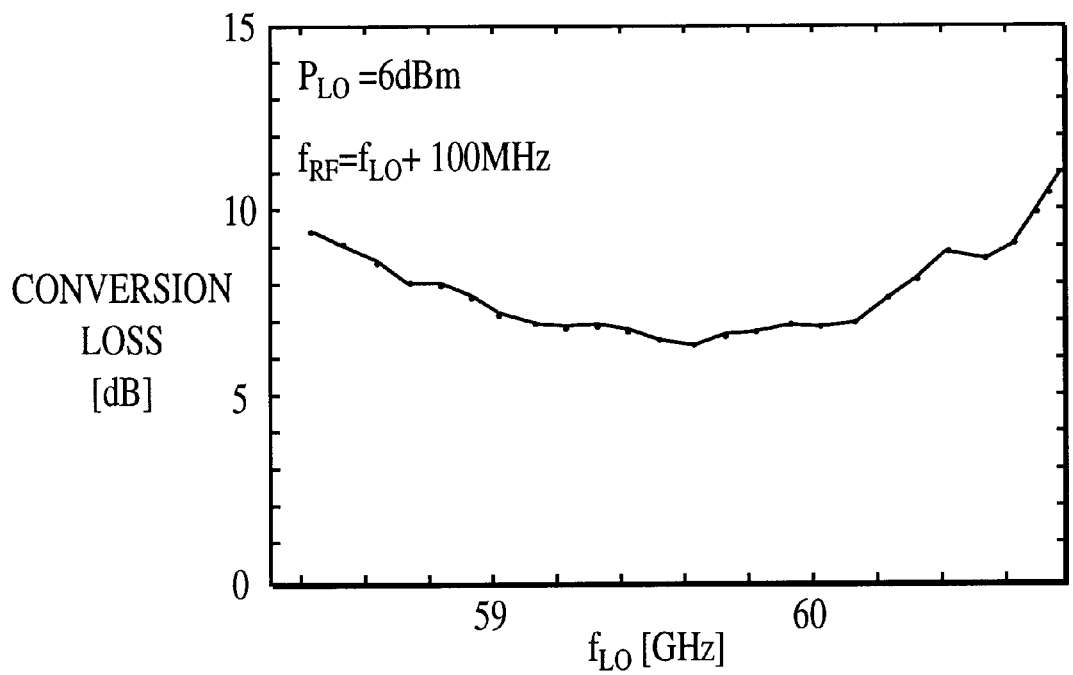
FIGS. 8A and 8B show electrical characteristics of the mixer shown in FIG. 7.
Figure 8B:
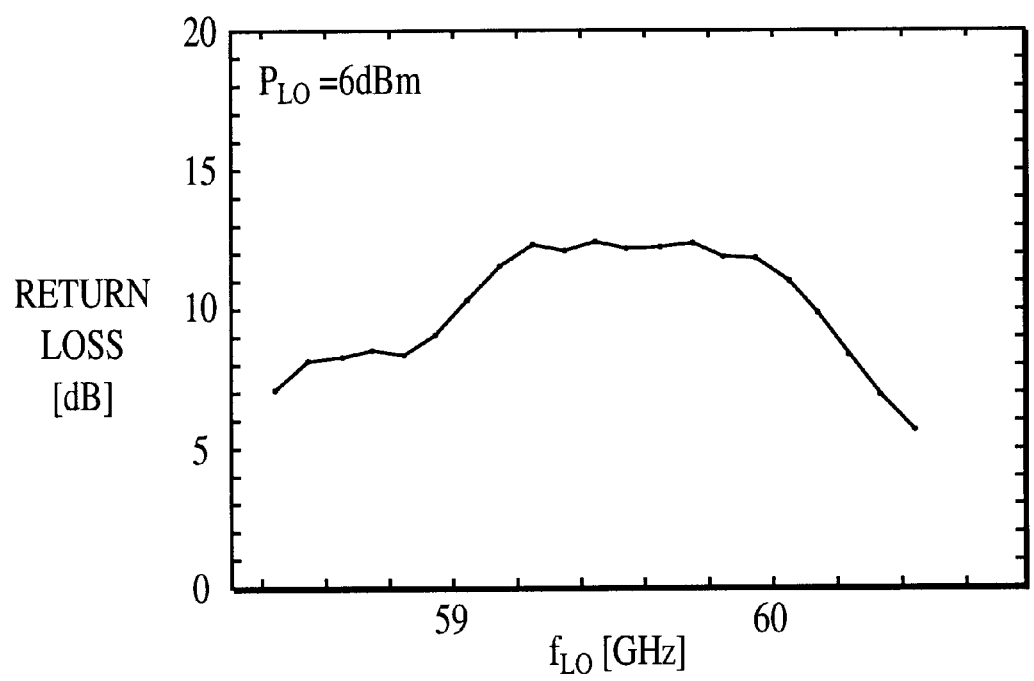

FIGS. 8A and 8B show electrical characteristics of the above-described mixer. A conversion loss characteristic (FIG. 8A) was obtained by setting the frequency of the IF signal to 100 MHz. When the frequency $f_{LO}$ of the local signal is about 59.6 GHz, the conversion loss is 7.5 dB or less and the return loss (FIG. 8B) is 10 dB or more. Thus, satisfactory matching between the NRD guide and the diode can be attained and the reflection at the mixer section of the NRD guide can be sufficiently limited.

Figure 9:
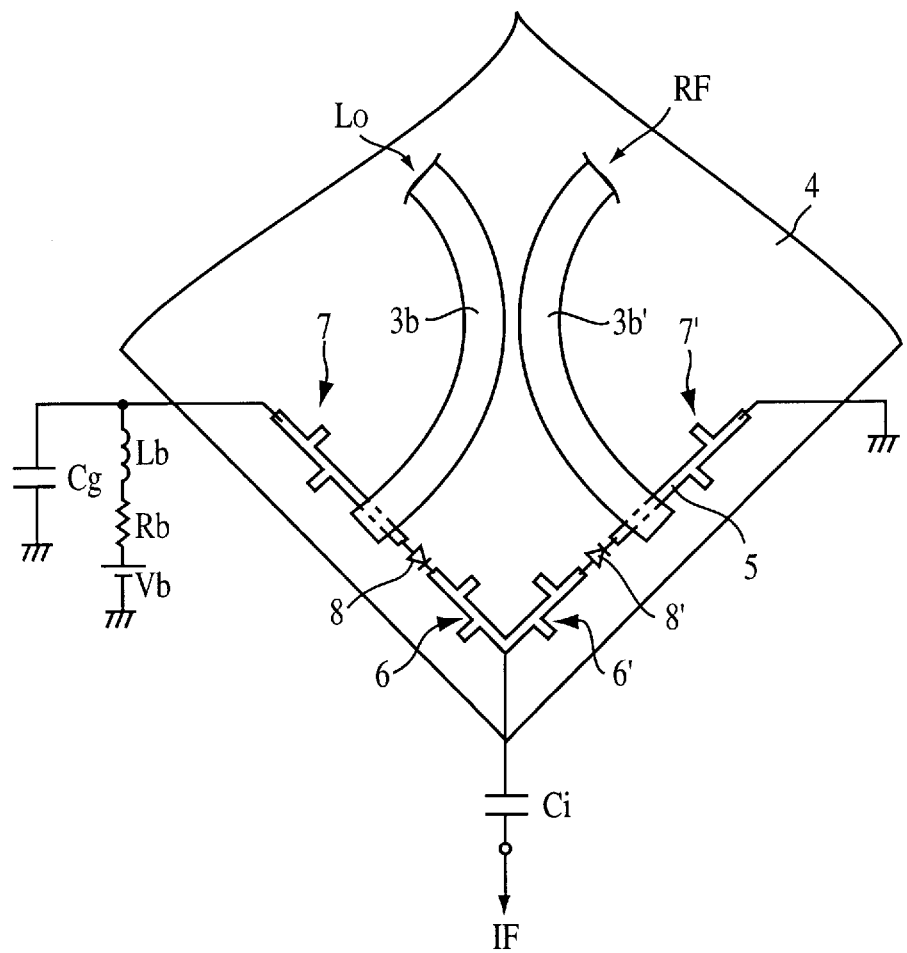
FIG. 9 is a diagram showing the configuration of a mixer which represents a third embodiment of the present invention.

FIG. 9 shows a mixer which represents a third embodiment of the present invention. FIG. 9 comprises a schematic plan view of a portion of the mixer shown without an upper conductor plate. A conductor pattern 5 forming filter circuits 7, 6, 6', and 7' with open stubs such as those described above, is formed on the upper surface of a circuit substrate 4. Two Schottky barrier diodes 8 and 8' are mounted on the conductor pattern 5. Dielectric strips 3b and 3b' are provided on the upper surface of the circuit substrate 4. Dielectric strips in the same pattern are also provided on the lower surface of the circuit substrate 4. That is, the circuit substrate 4 is interposed between the upper and lower dielectric strips. This structure, having the dielectric strips and the circuit substrate provided between flat conductor surfaces substantially parallel to each other, is the same as that shown in FIG. 1.

The above-described pair of dielectric strips have bent portions brought close to each other to form a coupler. A bias voltage supply circuit formed of components Lb, Rb and Vb is also connected to the conductor pattern. An RF signal and an Lo signal are thereby applied to the two diodes with respective phase differences of 90°, so that the respective frequency components of the difference therebetween are in phase opposition to each other. However, since the diodes are in opposite directions as seen from the IF circuit side, the frequency components of the difference are combined in phase with each other to be output as an IF signal through the capacitor Ci. A capacitor Cg is provided to ground the end of the conductor pattern 5 for high-frequency signals.

Incidentally, while the characteristic impedance of the NRD guide is large, about 600 ohms, that of the diode used in the detector or mixer in the operating state is small, from a few ohms to several tens of ohms. Therefore, impedance matching therebetween is important. An analysis method and an impedance matching method for such impedance matching will be described.

Figure 10:
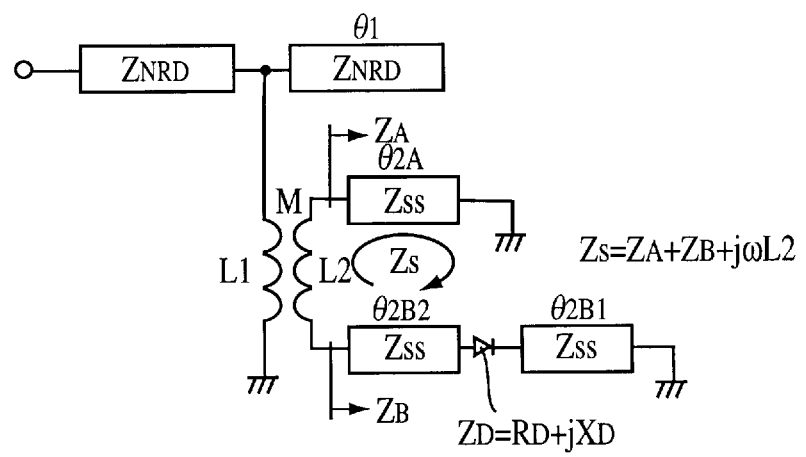
FIG. 10 is an equivalent circuit diagram of the diode circuit of the dielectric waveguide device.
Figure 11:
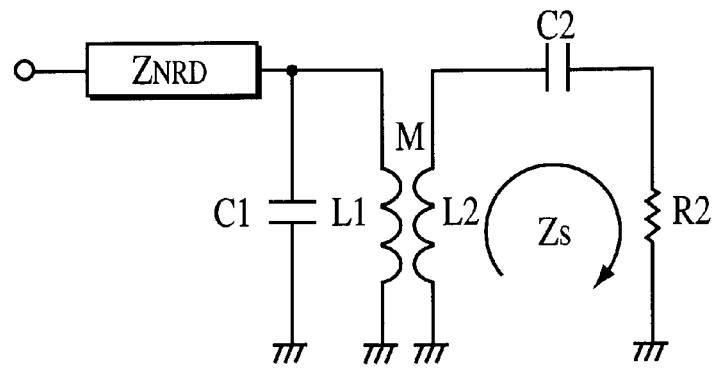
FIG. 11 is an equivalent circuit diagram transformed from FIG. 10.

The diode circuit for matching between the NRD guide and the diode can be represented by an equivalent circuit shown in FIG. 10. In FIG. 10, $Z_{NRD}$ is the characteristic impedance of the NRD guide, $Z_{SS}$ is the characteristic impedance of the suspended line, and $Z_D$ is the impedance of the diode, which can be shown by $R_D+jX_D$. The suspended line in which the diode is mounted and the NRD guide are magnetic-field-coupled as illustrated. If the impedances of the suspended line as seen from the magnetic field coupling point between the NRD guide and the suspended line are $Z_A$ and $Z_B$, the circuit shown in FIG. 10 can be transformed as shown in FIG. 11. Then the following equations are established:

$$Z_S = Z_A + Z_B + j\omega L2$$

$$1/(\omega C1) = Z_{NRD}/\tan\theta 1$$

$$-1/(\omega C2) = Im(Z_S) - \omega L2$$

$$R2 = Re(Z_S)$$

where $Im(Z_S)$ is the imaginary part of $Z_S$ while $Re(Z_S)$ is the real part of $Z_S$.

Figure 12A:
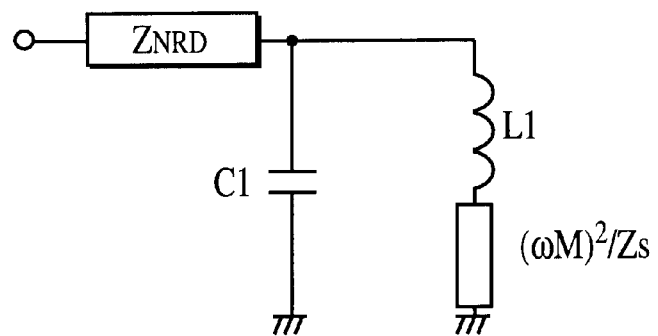
FIG. 12A is an equivalent circuit diagram obtained by changing the transformer portion shown in FIG. 11.
Figure 12B:
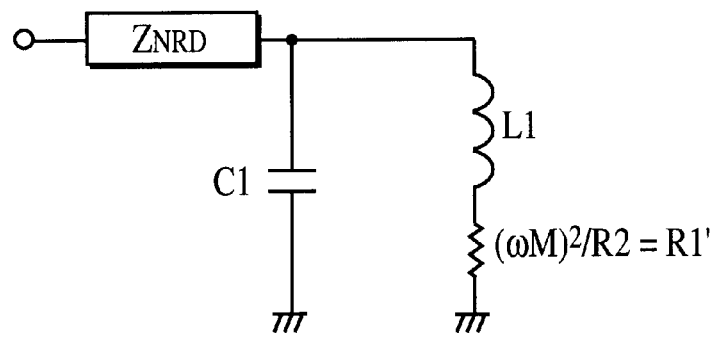
FIG. 12B is an equivalent circuit diagram when the suspended line is resonating.

The portion of the transformer shown in FIG. 11 can be rewritten as shown in FIG. 12A. Also, it is as shown in FIG.

Figure 13:
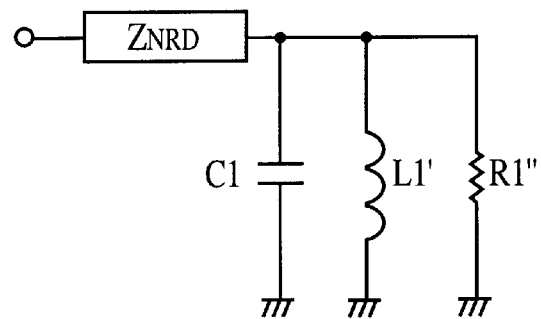
FIG. 13 is an equivalent circuit diagram obtained by series-parallel conversion of FIG. 12.

12B when the suspended line is resonating. It can be further series-parallel-converted as shown in FIG. 13. Then the following equations are established:

$$R1''=R1'(1+S^2)$$

$$L1'=L1(1+1/S^2)$$

$$S=\omega L1/R1'$$

Accordingly, in the matched state, the following equations are established:

$$Z_{NRD}=R1'(1+S^2)$$

$$1/(\omega C1)=\omega L1(1+1/S^2)$$

$$S=\omega L1/R1'=(L1/M)(R2/\omega M)$$

When M is sufficiently small, S>>1 and the above equations are rewritten as $$Z_{NRD}/R2=(L1/M)^2$$

$$1/(\omega C1)=\omega L$$

From these equations, it can be understood that matching of small R2 with large $Z_{NRD}$ can be achieved with a comparatively small M. It can also be understood that the compensation capacitance C1 with respect to L1 can be obtained by setting the positions of the NRD guide end and the suspended line (the distance d in FIG. 2).

Figure 14:
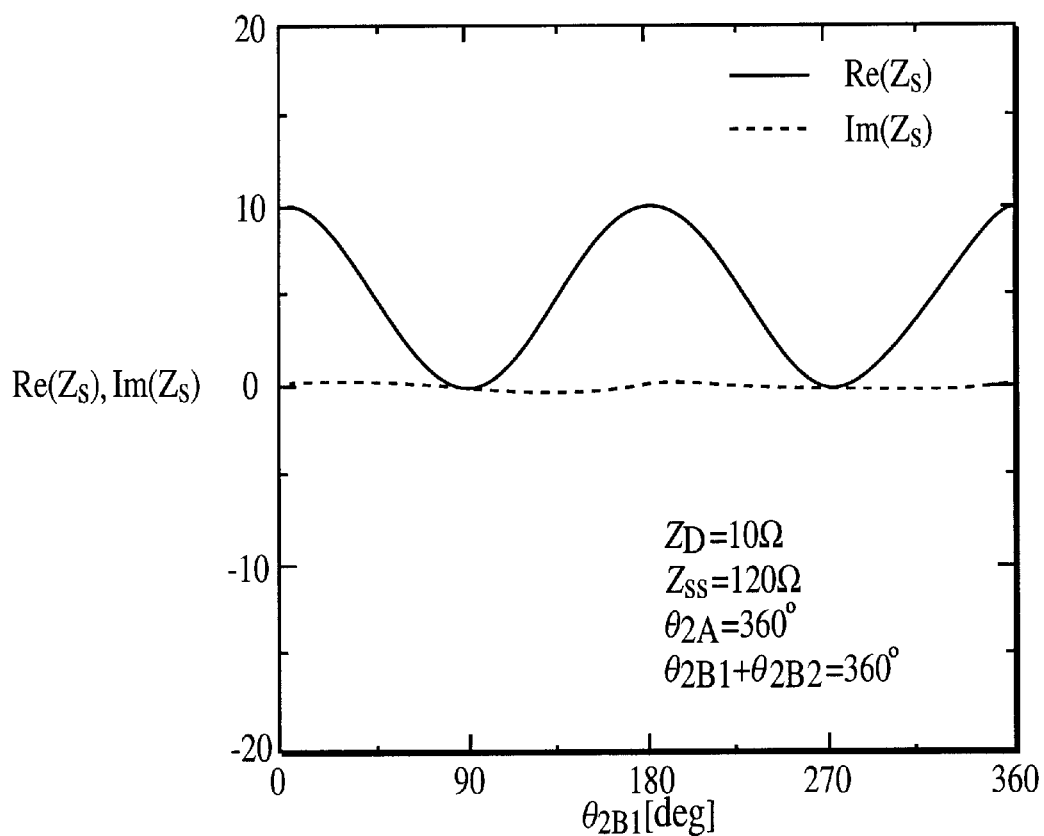
FIG. 14 is a graph showing the relationship between the mounted position of the diode and $Z_S$.

The relationship between the position where the diode is mounted and the above-described R2 will next be described. If L2 as shown in FIG. 10 and the reactance component $X_D$ of the diode are sufficiently small, then $Z_S$ measured when $\theta_{2B1}$ is changed while $\theta_{2B1}+\theta_{2B2}=360°$ and $\theta_{2A}=360°$, i.e., when the distance from the filter circuit to the mounted position of the diode is changed, is as shown in FIG. 14. (The unit of the abscissa of FIG. 14 is [Ω].) As can be understood from FIG. 14, $Z_S$ is maximized and R2 (=Re $(Z_S))=Z_D=R_D$ when the mounted position of the diode is at a distance of an integer multiple of ½ wavelength from the filter circuit. As the mounted position of the diode is shifted from this point, the value of $Z_S$ becomes smaller. Accordingly, if the impedance of the diode is large in comparison with the load impedance matched by the line width, impedance matching can be effected by changing the mounted position of the diode. For example, to set Re($Z_S$)=5 Ω when RD=10 Ω, the diode may be mounted at such a position that $\theta_{2B1}$ is, for example, about 135° or 225°.

Figure 15:
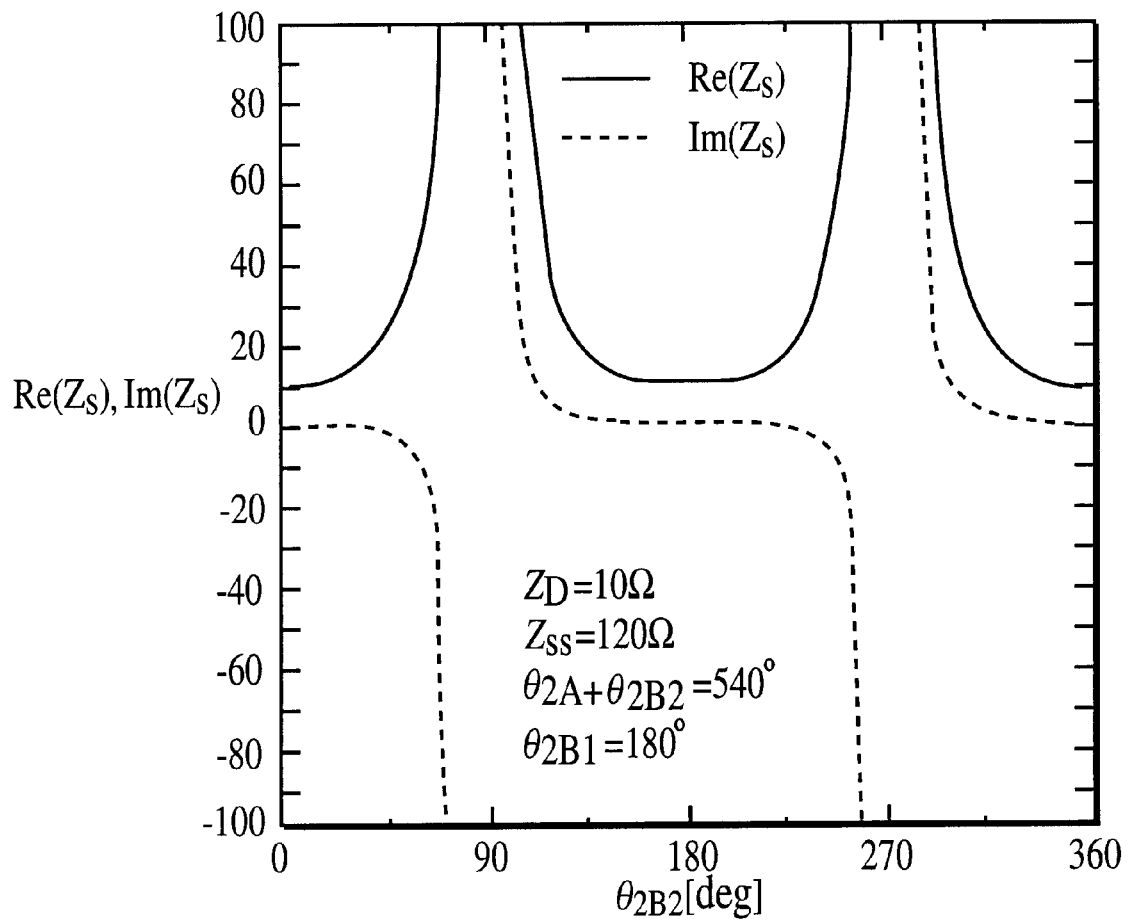
FIG. 15 is a graph showing the relationship between the NRD coupling position on the suspended line and $Z_S$.

The relationship between the NRD guide coupling position on the suspended line and R2 will next be described. If L2 as shown in FIG. 10 $X_D$ are sufficiently small, then $Z_S$ measured when $\theta_{2B2}$ is changed while $\theta_{2B1}=180°$ and $\theta_{2B2}+\theta_{2A}=540°$, i.e., when the NRD guide coupling position on the suspended line is changed is as shown in FIG. 15. As can be understood from FIG. 15, $Z_S$ is minimized and R2 (=Re($Z_S$))=$Z_D$=$R_D$ when the NRD guide coupling position is at a distance of an integer multiple of ½ wavelength from the filter circuit. As the NRD guide coupling position is shifted from this point, the value of $Z_S$ becomes larger.

Accordingly, if the impedance of the diode is small in comparison with the load impedance matched by the line width, impedance matching can be effected by changing the position of the NRD guide on the suspended line. For example, to set Re($Z_S$)=20 Ω when RD=10 Ω, the NRD guide coupling position on the suspended line may be set so that $\theta_{2B2}$ is, for example, about 135° or 225°. If L2 and $X_D$ cannot be regarded as zero, the distance between the filter circuits may be adjusted according to the values of L2 and $X_D$ so that the electrical distance between the filters is an integer multiple of ½ wavelength.

Figure 16A:
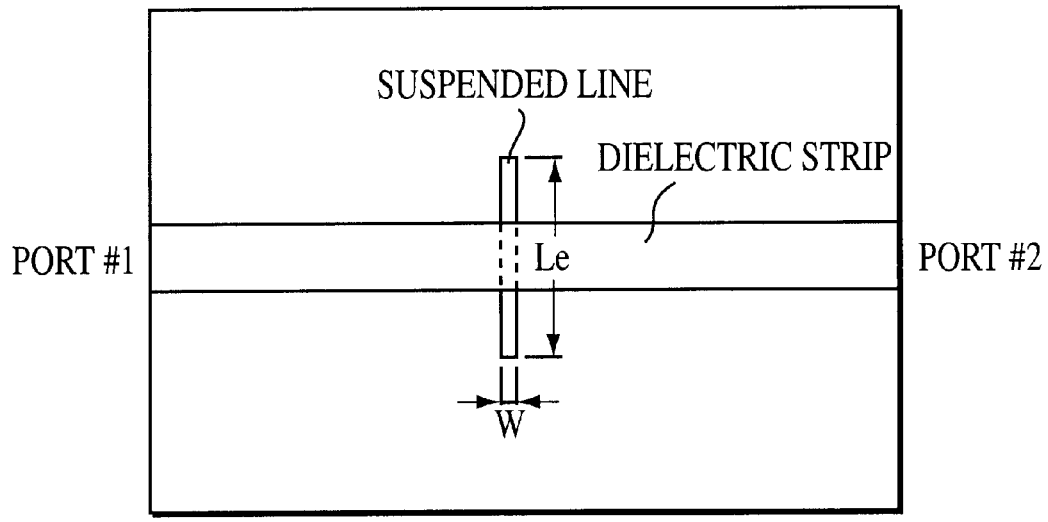
FIGS. 16A and 16B are a plan view and an equivalent circuit diagram, respectively, of a dielectric waveguide device for experimentally confirming the characteristics of coupling between the suspended line and the NRD guide.
Figure 16B:
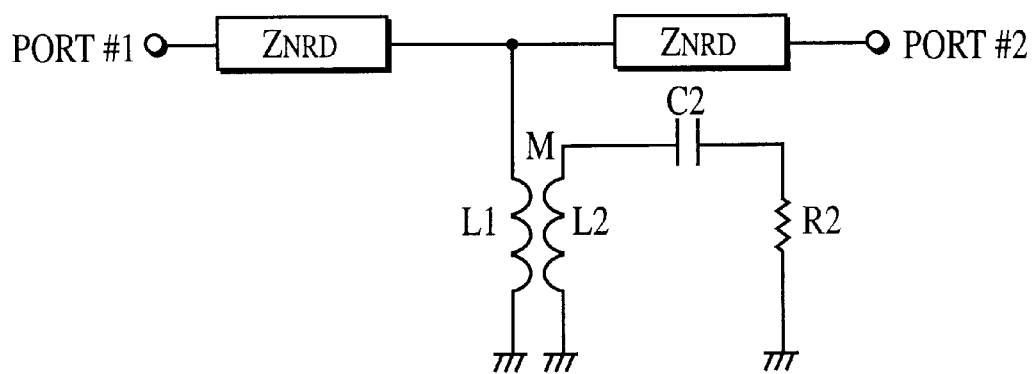

L1/M in the above equation can be changed by selecting the width of the suspended line. The results of an experiment made to confirm this effect are shown below. FIG. 16A shows a dielectric waveguide device measured for confirmation, in which a both-end-open suspended line having a width W and a length Le is disposed so as to extend across a dielectric strip. FIG. 16B shows an equivalent circuit diagram of this device. When R2 is sufficiently small, f1 and f2 can be approximated by the following equations:

$$f1 = \frac{1}{(2\pi\sqrt{(L2 \cdot C2)})}$$

$$f2 = \sqrt{\frac{1}{(L2 \cdot C2(1-k_{12}^2))}}$$

$$k_{12}^2 = \frac{M}{\sqrt{(L1 \cdot L2)}}$$

Figure 17A:
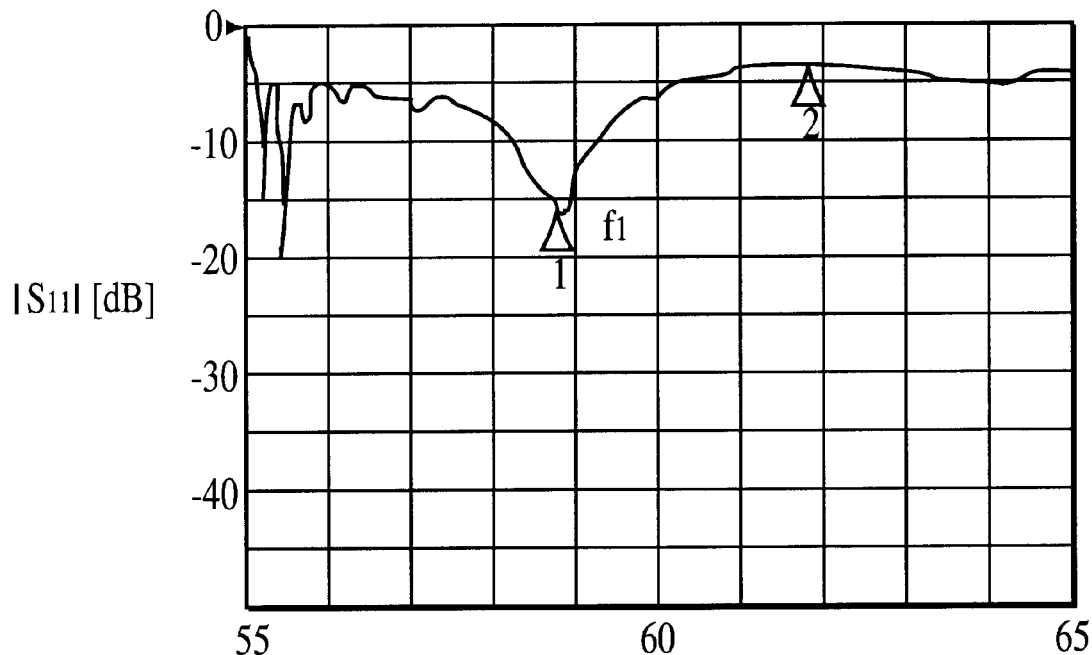
FIGS. 17A and 17B are graphs showing S parameter in the device shown in FIG. 16.
Figure 17B:
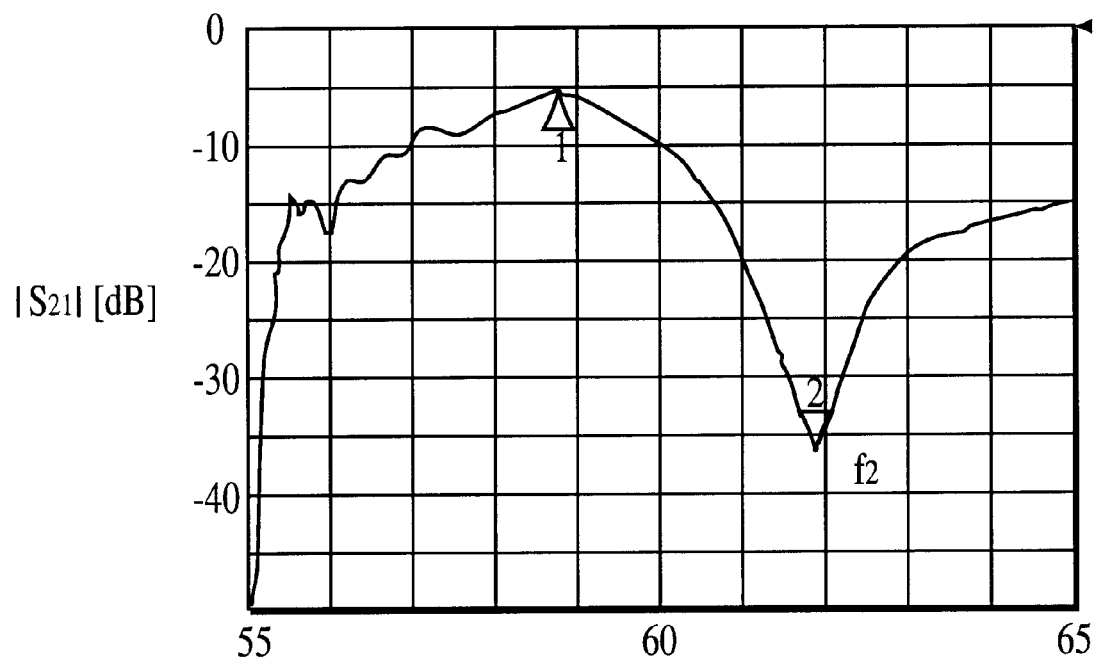
Figure 18:
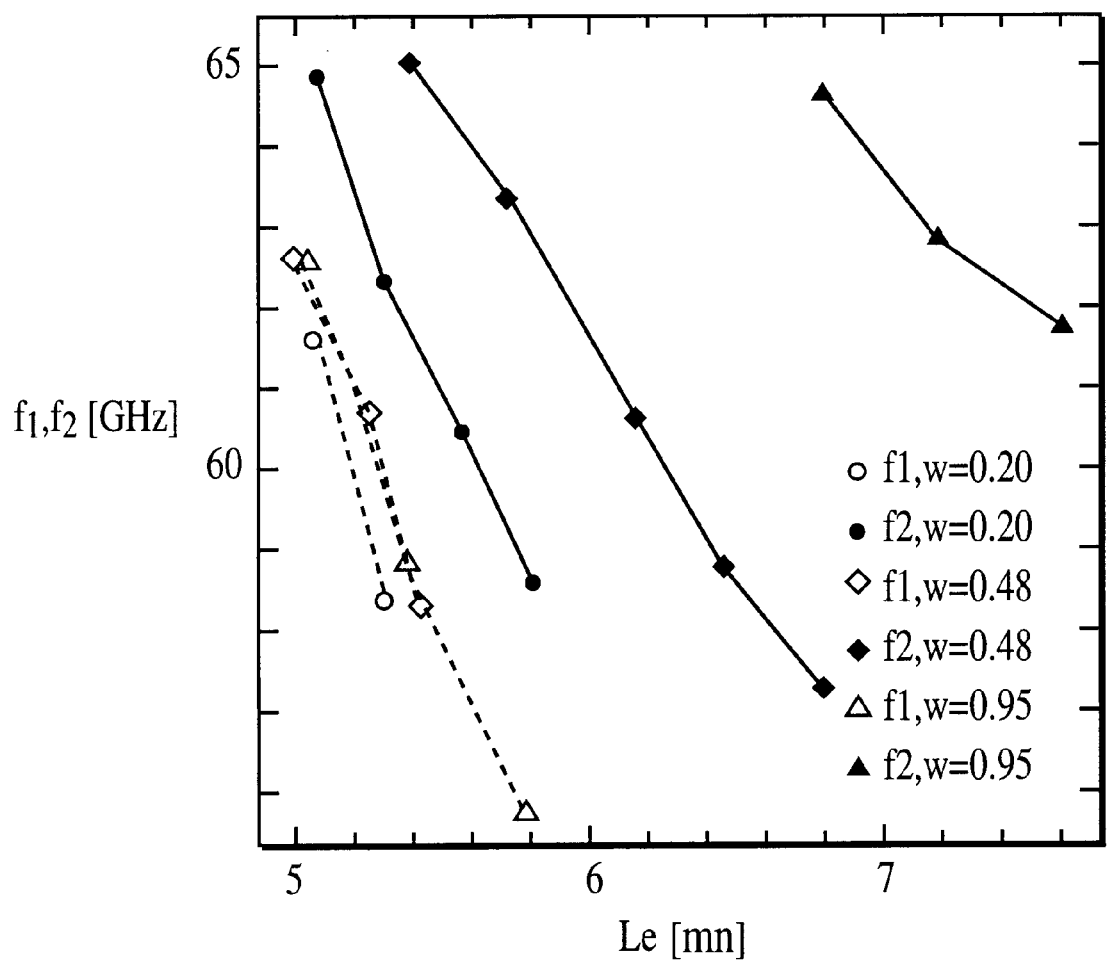
FIG. 18 is a graph showing changes in frequencies f1 and f2 with respect to the width and length of the suspended line in the device shown in FIG. 16.

If S11 characteristic and S21 characteristic of the above-described dielectric waveguide device are actually measured, a dip of S11 at frequency f1 and a dip of S21 at frequency f2 can be found, as shown in FIGS. 17A and 17B. The values of f1 and f2 were measured with respect to changes in the width W and the length Le of the suspended line. The results of this measurement are shown in FIG. 18. As can be understood from these results, the value of f2 varies largely depending on the width W of the suspended line while the value of f1 does not vary largely.

From the results of the experiments and the above equations, it can be understood that, when the width W of the suspended line is changed, $k_{12}$ changes but L2 does not change noticeably. Therefore, the value of L1/M can be changed by changing the width W of the suspended line.

According to the present invention, as described above, a circuit substrate is interposed between two flat conductor surfaces substantially parallel to each other. Thus, the facility with which the circuit substrate is mounted by being combined with a dielectric waveguide is improved. Also, the conductor pattern is disposed so as to intersect the dielectric strip substantially perpendicularly, and filter circuits are provided at each of at least two places in the conductor pattern on opposite sides of the dielectric strip, thus forming a resonance circuit. Also, a diode is mounted in the resonance circuit. Therefore, the suspended line forming the resonance circuit is coupled to the dielectric waveguide and resonates with the same to supply sufficiently large energy from the dielectric waveguide to the diode. That is, suitable matching between the dielectric waveguide and the diode can be achieved, thereby sufficiently limiting the conversion loss.

Further, according to the present invention, the resonance circuit resonates with a signal propagating through the dielectric waveguide, thereby maximizing the conversion efficiency.

What is claimed is:

1. A diode circuit in a dielectric waveguide device, comprising:
   a pair of flat conductor surfaces substantially parallel to each other;
   a dielectric strip and a circuit substrate provided between said conductor surfaces, said flat conductor surfaces and said conductor strip forming a dielectric waveguide;

an elongated conductor pattern formed on said circuit substrate so as to extend across said dielectric strip substantially perpendicularly to the same, said conductor pattern and said flat conductor surfaces forming a suspended line;

a filter circuit provided in said conductor pattern in each of at least two places on opposite sides of said dielectric strip to form a resonance circuit, said filter circuits stopping a signal coupled with said dielectric waveguide and propagating through said suspended line; and a diode mounted in series with said conductor pattern in said resonance circuit.

2. A diode circuit in a dielectric waveguide device according to claim 1, wherein the electrical length between the two filter circuits forming said resonance circuit is set to an integer multiple of approximately ½ wavelength of a signal propagating through said dielectric waveguide.

3. A diode circuit in a dielectric waveguide device according to claim 2, wherein the electrical length between said diode and at least one of said filter circuits is set to an integer multiple of approximately ½ wavelength of said signal.

4. A diode circuit in a dielectric waveguide device according to claim 3, wherein the electrical length between said dielectric waveguide and at least one of said filter circuits is set to an integer multiple of approximately ½ wavelength of said signal.

5. A diode circuit in a dielectric waveguide device according to claim 2, wherein the electrical length between said dielectric waveguide and at least one of said filter circuits is set to an integer multiple of approximately ½ wavelength of said signal.

6. A detector comprising:

a dielectric waveguide device including a diode circuit according to claim 2, adapted for receiving a radio-frequency signal which is input to said dielectric waveguide; and a circuit for extracting a detected signal out of the resonance circuit of said conductor pattern.

7. A mixer comprising:

a dielectric waveguide device including a diode circuit according to claim 2, adapted for inputting to said dielectric waveguide a signal which is obtained by mixing a radio-frequency signal and a local oscillator signal;

a circuit for applying a bias voltage to said diode from outside of the resonance circuit of said conductor pattern; and a circuit for extracting an intermediate-frequency signal from outside of the resonance circuit.

8. A detector comprising:

a dielectric waveguide device including a diode circuit according to claim 1, adapted for receiving a radio-frequency signal which is input to said dielectric waveguide; and a circuit for extracting a detected signal out of the resonance circuit of said conductor pattern.

9. A mixer comprising:

a dielectric waveguide device including a diode circuit according to claim 1, adapted for inputting to said dielectric waveguide a signal which is obtained by mixing a radio-frequency signal and a local oscillator signal;

a circuit for applying a bias voltage to said diode from outside of the resonance circuit of said conductor pattern; and a circuit for extracting an intermediate-frequency signal from outside of the resonance circuit.

* * * * *